United States Patent
Peter et al.

(10) Patent No.: US 12,027,375 B2
(45) Date of Patent: Jul. 2, 2024

(54) SELECTIVE ETCH USING A SACRIFICIAL MASK

(71) Applicant: Lam Research Corporation, Fremont, CA (US)

(72) Inventors: Daniel Peter, Sunnyvale, CA (US); Da Li, Newark, CA (US); Jengyi Yu, San Ramon, CA (US); Alexander Kabansky, Santa Clara, CA (US); Katie Nardi, San Jose, CA (US); Samantha SiamHwa Tan, Fremont, CA (US); Younghee Lee, Pleasanton, CA (US)

(73) Assignee: Lam Research Corporation, Fremont, CA (US)

(*) Notice: Subject to any disclaimer, the term of this patent is extended or adjusted under 35 U.S.C. 154(b) by 281 days.

(21) Appl. No.: 17/428,560

(22) PCT Filed: Feb. 11, 2020

(86) PCT No.: PCT/US2020/017659
§ 371 (c)(1),
(2) Date: Aug. 4, 2021

(87) PCT Pub. No.: WO2020/167765
PCT Pub. Date: Aug. 20, 2020

(65) Prior Publication Data
US 2022/0122848 A1  Apr. 21, 2022

Related U.S. Application Data

(60) Provisional application No. 62/805,474, filed on Feb. 14, 2019.

(51) Int. Cl.
*H01L 21/311* (2006.01)

(52) U.S. Cl.
CPC ... *H01L 21/31144* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 11,024,508 B2 * | 6/2021 | Zhang | H01L 21/30655 |
| 2012/0088369 A1 | 4/2012 | Weidman et al. | |
| 2014/0051256 A1 | 2/2014 | Zhong et al. | |

(Continued)

FOREIGN PATENT DOCUMENTS

WO   2019/023001   1/2019

OTHER PUBLICATIONS

International Search Report from International Application No. PCT/US2020/017659 dated Jul. 22, 2020.

(Continued)

*Primary Examiner* — Roberts P Culbert
(74) *Attorney, Agent, or Firm* — Beyer Law Group LLP

(57) ABSTRACT

A method for selectively etching a silicon oxide region with respect to a lower oxygen silicon containing region is provided. A sacrificial mask selectively deposited on the lower oxygen silicon containing region with respect to the silicon oxide region. An atomic layer etch selectively etches the silicon oxide region with respect to the sacrificial mask on the lower oxygen silicon containing region.

21 Claims, 4 Drawing Sheets

(56) References Cited

U.S. PATENT DOCUMENTS

2014/0210085 A1    7/2014   Wang et al.
2018/0166270 A1    6/2018   Cho et al.

OTHER PUBLICATIONS

Written Opinion from International Application No. PCT/US2020/017659 dated Jul. 22, 2020.
Taiwanese Office Action from Taiwanese Application No. 109104676 dated Jan. 31, 2024 with Machine Translation.

* cited by examiner

SELECTIVE ETCH USING A SACRIFICIAL MASK

CROSS-REFERENCE TO RELATED APPLICATION

This application claims the benefit of priority of U.S. Application No. 62/805,474, filed Feb. 14, 2019, which is incorporated herein by reference for all purposes.

BACKGROUND

The disclosure relates to methods of forming semiconductor devices on a semiconductor wafer. More specifically, the disclosure relates to the selective etching of silicon oxide ($SiO_2$).

In forming semiconductor devices, silicon oxide may be selectively etched with respect to other silicon containing regions and the reverse.

SUMMARY

To achieve the foregoing and in accordance with the purpose of the present disclosure, a method for selectively etching a silicon oxide region with respect to a lower oxygen silicon containing region is provided. A sacrificial mask selectively deposited on the lower oxygen silicon containing region with respect to the silicon oxide region. An atomic layer etch selectively etches the silicon oxide region with respect to the sacrificial mask on the lower oxygen silicon containing region.

In another manifestation, a method for selectively etching a silicon or SiN region with respect to a higher oxygen containing region like SiOCN, SiN or a metal oxide with an OH surface termination is provided. A sacrificial mask is selectively deposited on the higher oxygen containing region with respect to the silicon or SiN region. The silicon or SiN region is selectively etched with respect to the sacrificial mask on the higher oxygen containing region.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Figure 1:
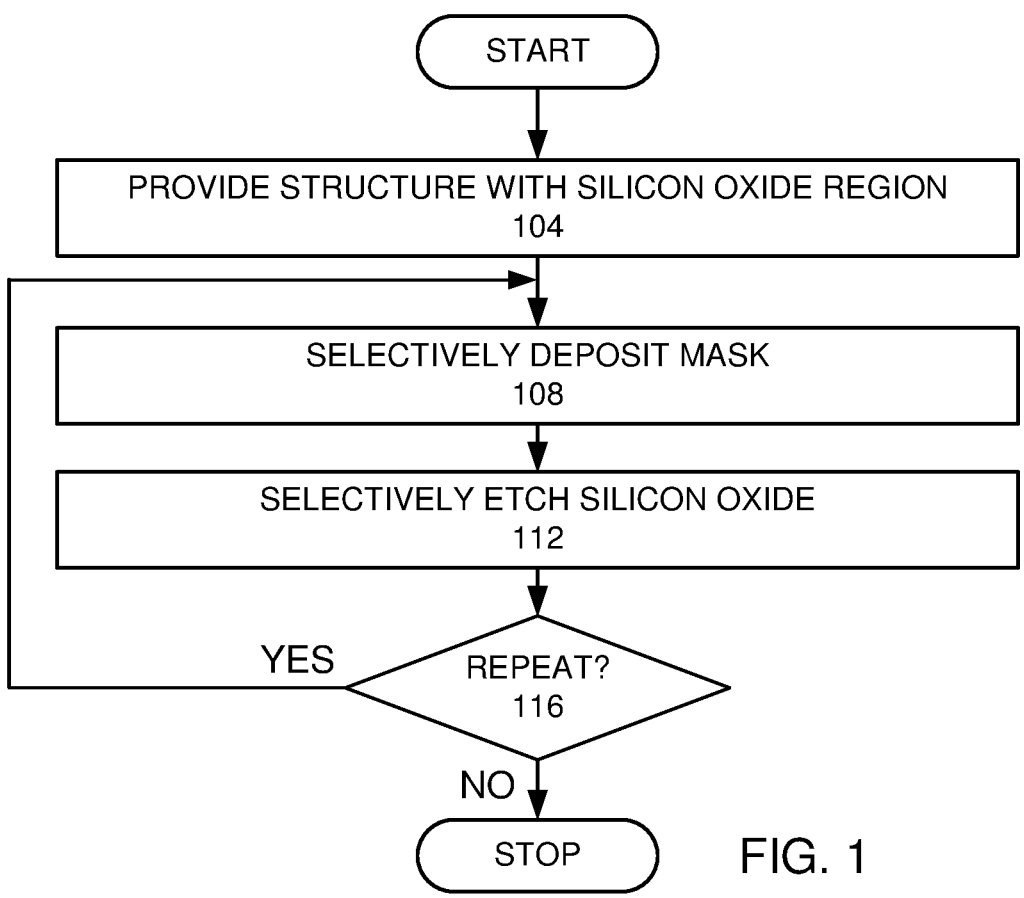
FIG. 1 is a high level flow chart of an embodiment.
Figure 2A:
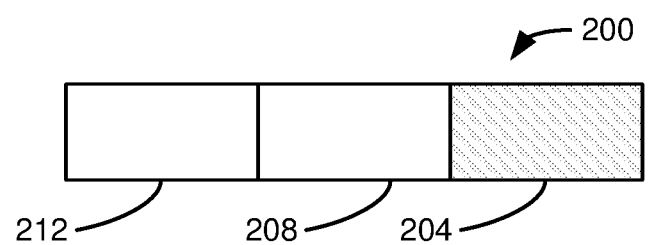
FIGS. 2A-C are schematic cross-sectional views of structures processed according to an embodiment.

FIG. 1 is a high level flow chart of an embodiment. A structure with a silicon oxide region is provided (step 104). FIG. 2A is a schematic cross-sectional view of part of a structure 200 with a silicon oxide region 204. In this example, the structure 200 also has a silicon oxycarbonitride (SiOCN) region 208, and a silicon (Si) region 212. The silicon region 212 may be crystalline or polycrystalline, or amorphous silicon. The SiOCN material includes silicon oxynitride (SiON), silicon oxycarbide (SiOC), silicon carbonitride (SiCN), organosilicon oxide (SiOCHx) (back end of line (BEOL) low-k), silicon nitride (SiN), and silicon carbide (SiC). The SiOCN region 208 and the Si region 212 are designated as lower oxygen silicon containing regions since they have a lower concentration of oxygen than the silicon oxide regions 204.

Figure 2B:
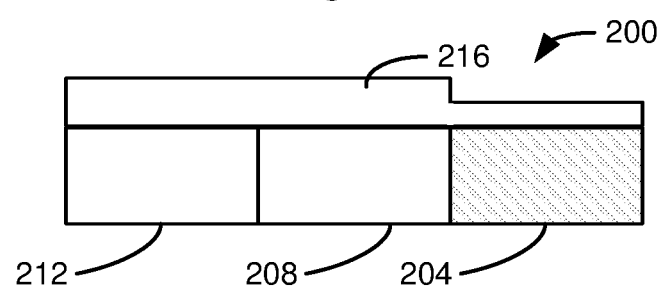

A sacrificial mask is selectively deposited on the lower oxygen silicon containing regions 208, 212 with respect to the silicon oxide region 204 (step 108). In this embodiment, a carbon containing sacrificial mask is selectively deposited on the lower oxygen silicon containing regions 208, 212. In an example, surfaces of the silicon oxide region 204, SiOCN region 208, and Si region 212 are cleaned with a 0.5% aqueous solution of hydrogen fluoride (HF). The hydrogen fluoride may be a gaseous or aqueous solution. A preplasma treatment with argon (Ar), helium (He), or hydrogen ($H_2$) may be used to further clean and activate the SiOCN region 208 and Si region 212. A deposition gas of 5-50 sccm methane ($CH_4$), 0-200 sccm $H_2$, and 50-500 sccm argon (Ar) is formed into a plasma by providing 50-500 watts radio frequency (RF) power. A pressure is maintained at 5-150 millitorr. A bias power of 0-200 volts is provided. FIG. 2B is a schematic cross-sectional view of part of the structure 200 after a sacrificial mask 216 has been deposited. The deposition process selectively deposits a thinner sacrificial mask on the silicon oxide region 204 than on the SiOCN region 208 and the Si region 212. If a thicker sacrificial mask 216 is desired, the preplasma treatment and the mask deposition may be cyclically repeated a plurality of times. In other embodiments, the noble gas Ar may be replaced with other noble gases, such as helium, neon, xenon, or krypton.

Figure 2C:
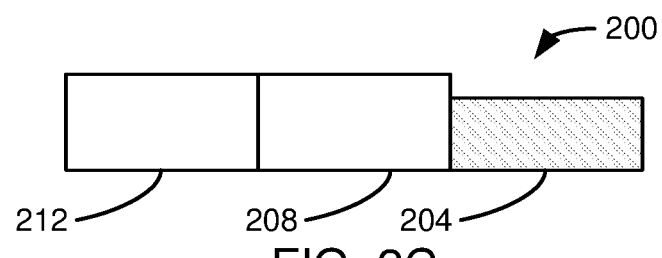

The silicon oxide region 204 is selectively etched using an atomic layer etch (step 112). In this embodiment, the atomic layer etch provides a reactant gas of hexafluoro-2-butyne ($C_4F_6$). The $C_4F_6$ selectively forms a deposition layer over this silicon oxide region 204. The reactant gas is purged and an activation gas of Ar is provided. The Ar activates the deposition layer causing deposited fluorine to etch the silicon oxide region 204. The atomic layer etch process may be repeated for a plurality of cycles. FIG. 2C is a cross-sectional view of the structure 200 after the atomic layer etch is complete. In this example, the silicon oxide region 204 is partially etched and the sacrificial mask 216 has been etched away. The selective mask deposition (step 108) and selectively etching the silicon oxide region 204 (step 112) may be repeated (step 116), until the silicon oxide region 204 is sufficiently etched.

Without the selective mask deposition (step 108) the selectively etching the silicon oxide region 204 (step 112) would significantly etch the SiOCN region 208 and the Si region 212. By providing the selective mask deposition (step 108) the selectivity of the etching of the silicon oxide region 204 (step 112) is significantly improved.

Figure 3:
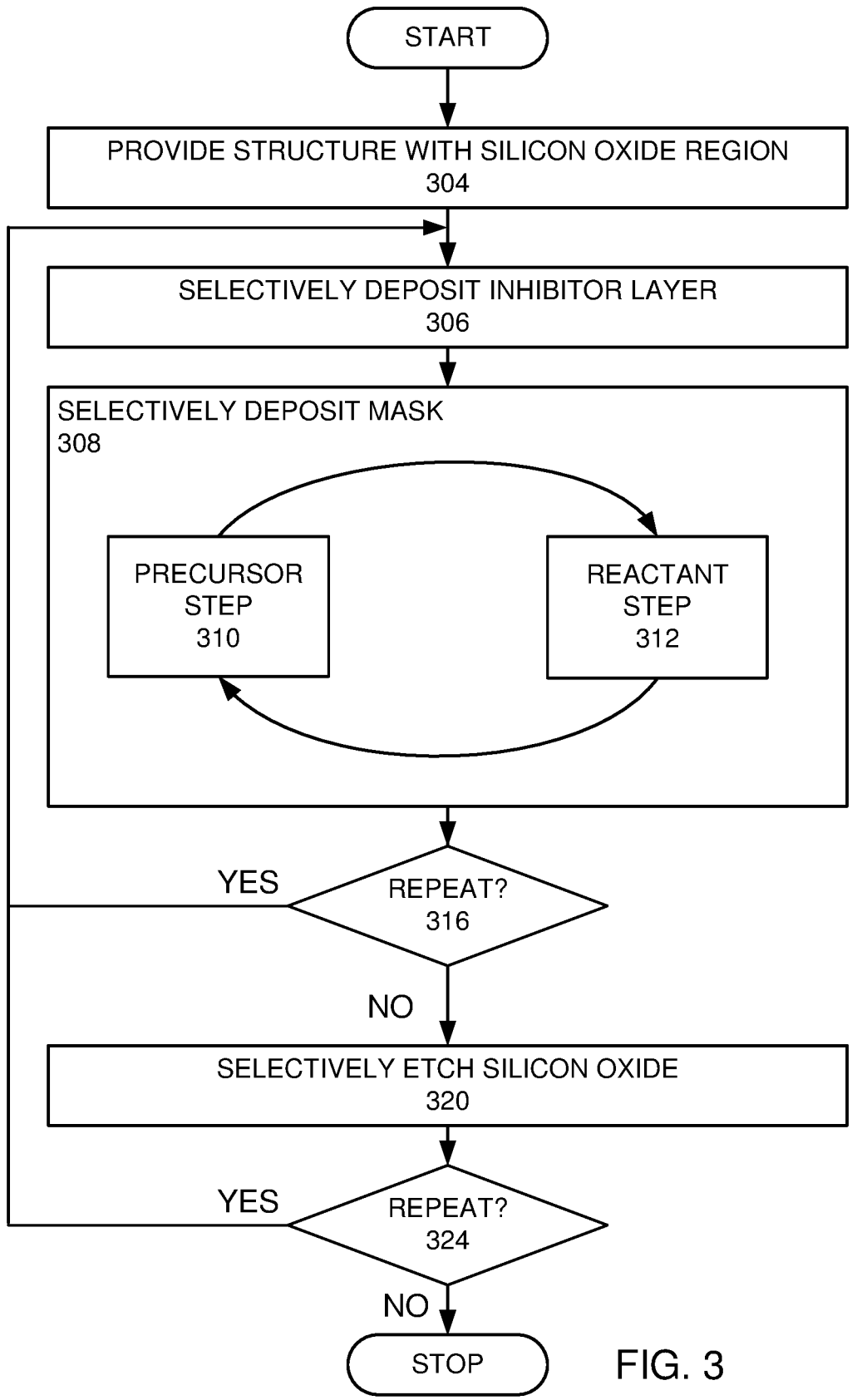
FIG. 3 is a high level flow chart of another embodiment.
Figure 4A:
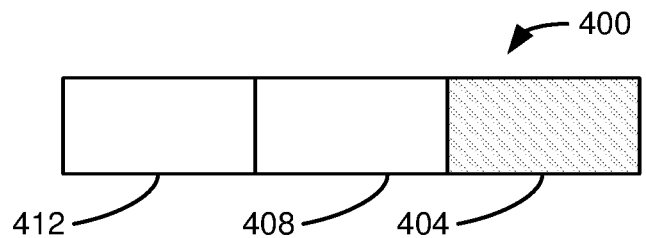
FIGS. 4A-D are schematic cross-sectional views of a structure processed according to the embodiment of FIG. 3.

In another embodiment, the sacrificial mask comprises metal containing layer using an atomic layer deposition (ALD) process. FIG. 3 is a high level flow chart of another embodiment. The deposition of the inhibitor layer can be deposited before metal containing layer deposition. This metal containing layer can be a metal oxide, metal carbide, metal nitride or a mixture thereof. This cycle of deposition of inhibitor and metal oxide can be cycled. A structure with a silicon oxide region is provided (step 304). FIG. 4A is a schematic cross-sectional view of part of a structure 400 with a silicon oxide region 404. In this example, the structure 400 also has a silicon oxycarbonitride (SiOCN) region 408, and a silicon (Si) region 412. The silicon region 412 may be crystalline or polycrystalline, or amorphous silicon. The SiOCN material includes SiON, SiOC, SiCN, SiOCHx (BEOL low-k), SiN and SiC. The SiOCN region 408 and the Si region 412 are designated as lower oxygen silicon containing regions since they have a lower concentration of oxygen than the silicon oxide regions. In this embodiment, the surfaces of the silicon oxide region 404, SiOCN region 408, and Si region 412 are cleaned with a 0.5% aqueous solution of HF. The surfaces of the silicon oxide region 404, SiOCN region 408, and Si region 412 are rinsed with deionized water (DIW).

Figure 4B:
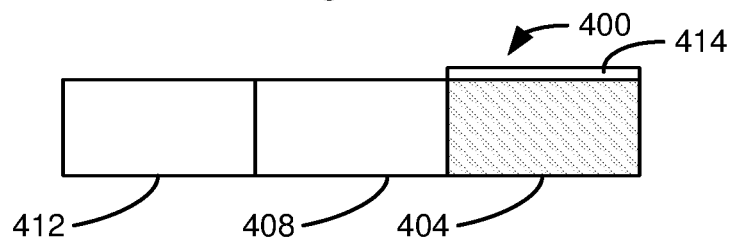

An inhibitor layer is selectively deposited on the silicon oxide region 404 with respect to the SiOCN region 408 and the Si region 412 (step 306). In this example, the inhibitor layer (414) is a self assembled monolayer that selectively bonds to surface silanol groups. The deposition of the inhibitor layer can be done in a liquid spin coat process or in a gas phase process. Inhibitor molecules can include organosilane compounds like: HMDS (hexamethyldisilazane), ODTS (Octadecyltrichlorosilane), FOTS (1H, 1H, 2H, 2H-Perfluorooctyltrichlorosilane), alkenes (like: 1-octadecene, 1-octene, 1-pentene). For a liquid process, the precursor molecules are dissolved in an organic non-polar solvent. A gas phase process uses the vapor pressure of the molecules. For the liquid phase process, the following sequence is used: Isopropyl alcohol (IPA) is used to displace the DIW due to non-miscibility with the non-polar solvent of the precursor. Subsequently, the non-polar solvent with the pre-cursor replaces the IPA. The precursor is dispensed until surface coverage on silicon oxide is achieved. Finally, the pre-cursor is replaced by IPA and dried using standard IPA drying. IPA drying may include the drying method as previously described. Drying methods described in US Patent Application 2017/0345681 may be used in various embodiments. For a gas phase process, the substrate is placed on a heated pedestal. The temperature may be from 20-250° C. Pressure may be from 10 mTorr to 30 Torr. Vapor from the inhibitor is flowed over the wafer and then purged from the chamber. A catalyst such as water or ammonia gas may be flowed over the wafer. The cycle may be repeated until the desired film is achieved. FIG. 4B is a schematic cross-sectional view of part of a structure 400 after an inhibitor layer 414 has been selectively deposited over the silicon oxide region 404.

A sacrificial mask is selectively deposited on the lower oxygen silicon containing regions 408, 412 with respect to the silicon oxide region 404 (step 308). In this embodiment, an atomic layer deposition process is used to provide the sacrificial mask, where the inhibitor layer 414 increases the selectivity of the deposition. In this embodiment, the selective deposition of the sacrificial mask (step 308) comprises a plurality of cycles of a metal precursor deposition step (a precursor step) (step 310) and a reactant step (step 312) to provide the selective atomic layer deposition process. In some embodiments, a purge is provided between the metal precursor deposition step (step 310) and the reactant step (step 312). The metal precursor deposition step (step 310) provides a metal containing precursor deposition.

After the metal containing precursor layer has been selectively deposited on the SiOCN region 208 and the Si region 412, the reactant forms a metal containing layer such as a metal oxide, metal carbide, or metal nitride provided in a reactant step (step 312). In various embodiments, the reactant may be an oxygen containing reactant, a nitrogen containing reactant, or a carbon containing reactant.

The selective deposition of the inhibitor reduces deposition of the metal containing layer on the silicon oxide region 404, so that more metal oxide, metal carbide, or metal nitride is deposited on the SiOCN region 408 and the Si region 412. The surface density of the inhibitor film determines how long the deposition is prevented. The partial deposition of the inhibitor on the SiOCN region 408 and Si region 412 allows earlier growth of at least one of metal oxide, metal carbide, or metal nitride compared to the full inhibitor layer on silicon oxide region 404.

Figure 4C:
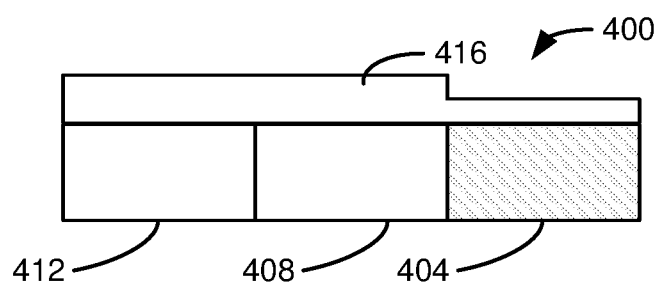

In an embodiment, the at least one of metal oxide, metal carbide, and metal nitride is a titanium dioxide deposited by a thermal ALD process. A cyclic process between a Ti containing precursor (step 310) and an oxidizer, as a reactant, (step 312) is used to deposit the titanium dioxide. The Ti pre-cursor can be titanium(IV) isopropoxide, tetrakis (diethylamido)titanium(IV), tetrakis(dimethylamido)titanium(IV), tetrakis(ethylmethylamido)titanium(IV), titanium tetrachloride. The oxidizer can be water ($H_2O$) vapor, oxygen ($O_2$), peroxide ($H_2O_2$), or ozone ($O_3$). FIG. 4C is a schematic cross-sectional view of part of a structure 400 after sacrificial mask 416 has been selectively deposited over the silicon oxide region 404. In this embodiment, the deposition of the sacrificial mask 416 removes the inhibitor layer 414. The deposition process selectively deposits a thinner sacrificial mask 416 on the silicon oxide region 404 than on the SiOCN region 408 and the Si region 412, due to the inhibitor layer 414. If a thicker sacrificial mask 416 is desired, the selective deposition of the inhibitor layer (step 306) and the selective deposition of the sacrificial mask (step 308) may be cyclically repeated (step 316).

In other embodiments, the metal containing precursors may contain tungsten (W), molybdenum (Mo), titanium (Ti), zirconium (Zr), hafnium (Hf), antimony (Sb), vanadium (V), tantalum (Ta), aluminum (Al), yttrium (Y), or nickel (Ni). In various embodiments, that at least one metal oxide, metal carbide, or metal nitride sacrificial mask may be at least one of titanium dioxide ($TiO_2$), zirconium dioxide ($ZrO_2$), hafnium dioxide ($HfO_2$), antimony (SbO), vanadium oxide ($V_2O_3$), yttria (YO), tantulum oxide (TaO), or aluminum oxide ($Al_2O_3$).

In various embodiments, a sacrificial mask of $HfO_2$ is used. In such an embodiment, an Hf containing precursor (step 310) and an oxidizer, as a reactant, (step 312) are used to deposit the hafnium dioxide. The Hf containing precursor can be at least one of hafnium(IV) tert-butoxide, tetrakis (diethylamido) hafnium (IV), tetrakis(dimethylamido) hafnium (IV), tetrakis(ethylmethylamido) hafnium (IV), hafnium tetrachloride. Etch selectivity of $HfO_2$ and $TiO_2$ to $SiO_2$ is 30:1 and 5:1, respectively. The oxidizer can be one or more of water ($H_2O$) vapor, oxygen ($O_2$), peroxide ($H_2O_2$), or ozone ($O_3$). In various embodiments, where the sacrificial layer is a metal nitride, the reactant may be at least one of ammonia ($NH_3$), hydrazine ($N_2H_4$) In other embodiments, where the sacrificial layer is a metal carbide, the reactant may be at least one of methane ($CH_4$), ethylene ($C_2H_4$) and acetylene ($C_2H_4$).

In other embodiments, a sacrificial mask of $ZrO_2$ is used. In such embodiments, a Zr containing precursor (step 310) and an oxidizer, as a reactant, (step 312) are used to deposit the $ZrO_2$. The Zr containing precursor can be at least one of zirconium (IV) tert-butoxide, tetrakis(diethylamido) zirconium (IV), tetrakis(dimethylamido) zirconium (IV), tetrakis (ethylmethylamido) zirconium (IV), zirconium tetrachloride. The oxidizer can be one or more of water ($H_2O$) vapor, oxygen ($O_2$), peroxide ($H_2O_2$), or ozone ($O_3$).

A dedicated defect control step can be used to clean up any residual metal oxide on the silicon oxide surface. This can be a boron trichloride ($BCl_3$) based plasma process using a defect control gas of 5-100 standard cubic centimeters per minute (sccm), $BCl_3$, 50-300 sccm chlorine ($Cl_2$), and 0-500 sccm helium (He) at a pressure of 5-150 milliTorr. RF power is provided at 100-500 watts. A bias of 0-50 volts is provided.

Figure 4D:
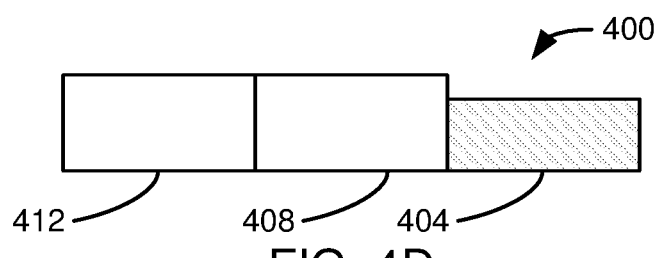

An atomic layer etch is used to selectively etch the silicon oxide region 404 with respect to the silicon region 412 and the SiOCN region 408. Since the atomic layer etch selectively etches lower oxygen containing silicon regions with respect to silicon oxide regions the atomic layer etch described in the previous embodiment may be used. In this embodiment, the atomic layer etch provides a reactant gas of fluorocarbon such as hexafluoro-2-butyne ($C_4F_6$) or octafluorocyclobutane ($C_4F_8$). The fluorocarbon selectively forms a deposition layer over this silicon oxide region 404. The reactant gas is purged and an activation gas of Ar is provided. The Ar activates the deposition layer causing deposited fluorine to etch the silicon oxide region 404. The atomic layer etch process may be repeated for a plurality of cycles. FIG. 4D is a schematic cross-sectional view of part of a structure 400 after an atomic layer etch has been completed.

With continued scaling of semiconductor devices, the distance between feature shrinks and the edge placement error of lithography becomes a significant issue. To alleviate this the industry has been adopting self aligned schemes as for example for the etching of contact holes. In this scheme, the placement of the contact hole can overlap with the gate spacer. As a result, the contact silicon oxide etch needs to be selective to the spacer material. At the same time, the material budget is shrinking. The shrinking budget increases the selectivity requirement of targeted etch vs. remaining (untouched material). Conventional fluorocarbon ($C_xF_y$)/Ar based silicon oxide ALE has shown a path higher material selectivity but still suffers from an initial loss of tens of Å.

Another approach is the selective deposition of material as an additional sacrificial mask to selectively protect the materials that are not supposed to be etched. This requires a high selectivity during the deposition process that no material nucleates on the region to be etched. Any nuclei's would form the base of defects for the subsequent etch process and therefore are not acceptable.

Various embodiments provide a surface treatment that enhances the selective nucleation delay. The surface treatment may include an inhibitor layer. Various embodiments provide material selective deposition of a sacrificial mask. Various embodiments provide defect control on an open area of the sacrificial mask. Various embodiments provide a selective etch of the underlying material of the open area of the sacrificial mask.

Choosing an appropriate pre-treatment enables the selective deposition of the sacrificial mask by differentiating the materials based on the density of reactive sites. The pre-treatment can enhance reactive sites by activation like plasma treatment or deactivation by inhibitor. Examples are self assembled monolayers (gas and liquid) phase, polymer, or carbon based inhibitor, in-situ pre-treatment: ammonia ($NH_3$), hydrazine ($N_2H_4$), hydrogen ($H_2$), water ($H_2O$), peroxide ($H_2O_2$), oxygen ($O_2$), ozone ($O_3$), and vapor phase reactions.

The deposition of the sacrificial mask depends on the density of reactive sites by choosing conditions that do not or limit the chemical modification of the surface besides the deposition.

In other embodiments, a sacrificial mask of silicides may be used. In some embodiments, a silicon oxide region contains silicon oxide and may have an additional dopant, but have a higher concentration of oxygen than the lower oxygen silicon containing regions.

In other embodiments, a method for selectively etching a silicon or a silicon nitride (SiN) region with respect to higher oxygen containing region like SiOCN, SiN or a metal oxide with a hydroxide (OH) surface termination is provided. A sacrificial mask is selectively deposited on the higher oxygen containing region with respect to the silicon or SiN region. The silicon or SiN region is selectively etched with respect to the sacrificial mask on the higher oxygen containing region. In some embodiments, the sacrificial mask is based on a metal oxide. The metal oxide is deposited selectively onto the higher oxygen containing region. The metal oxide can be a titanium oxide, zirconium oxide, or a hafnium oxide deposited by a thermal ALD process, using a cyclic process between a Ti, Zr, or Hf containing precursor and an oxidizer used to deposit the titanium, zirconium, or hafnium oxide, wherein the oxidizer can be $H_2O$ vapor, $O_2$, or $O_3$. In some embodiments, the deposition of the sacrificial mask on the higher oxygen containing region is enhanced by a surface treatment.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for selectively etching a silicon oxide region with respect to a lower oxygen silicon containing region, comprising:
    a) selectively depositing a sacrificial mask on the lower oxygen silicon containing region with respect to the silicon oxide region; and
    b) selectively etching with an atomic layer etch the silicon oxide region with respect to the sacrificial mask on the lower oxygen silicon containing region, comprising a plurality of cycles, wherein each cycle, comprises:
        i) providing a reactant gas to selectively form a deposition layer on the silicon oxide region;
        ii) purging the reactant gas; and
        iii) providing an activation gas causing the deposition layer to be activated resulting in at least partially etching the silicon oxide region and the sacrificial mask.

2. The method, as recited in claim 1, wherein steps a and b are repeated a plurality of times.

3. The method, as recited in claim 1, wherein the lower oxygen silicon containing region is at least one of silicon, silicon carbide, silicon nitride, silicon oxynitride, silicon carbonitride and silicon oxycarbonitride.

4. The method as recited in claim 1, further comprising selectively depositing an inhibitor layer on the silicon oxide region, wherein the sacrificial mask is based on at least one of a metal oxide, metal carbide, or metal nitride, wherein the at least one of a metal oxide, metal carbide, or metal nitride is deposited selectively onto the lower oxygen containing film while being delayed from deposition on the silicon oxide region by the inhibitor layer.

5. The method, as recited in claim 4, wherein the at least one of a metal oxide, metal carbide, or metal nitride is deposited by an atomic layer deposition process, using a cyclic process comprising a metal containing precursor step and a reactant step.

6. The method as recited in claim 5, wherein the metal containing precursor step comprises depositing a metal containing precursor containing at least one of tungsten, molybdenum, titanium, zirconium, hafnium, antimony, vanadium, tantalum, aluminum, yttrium, or nickel.

7. The method, as recited in claim 5, wherein the reactant step comprises providing a reactant that is at least one of an oxygen containing reactant, a nitrogen containing reactant, or a carbon containing reactant.

8. The method, as recited in claim 5, further comprising providing a purge between the metal containing precursor step and the reactant step.

9. The method, as recited in claim 5, wherein the sacrificial mask comprises hafnium dioxide.

10. The method, as recited in claim 9, wherein the metal containing precursor step comprises depositing a metal containing precursor of at least one of hafnium(IV) tert-butoxide, tetrakis(diethylamido) hafnium (IV), tetrakis(dimethylamido) hafnium (IV), tetrakis(ethylmethylamido) hafnium (IV), hafnium tetrachloride and wherein the reactant step comprises providing a reactant that is at least one of water vapor, oxygen, peroxide, or ozone.

11. The method, as recited in claim 5, wherein the sacrificial mask comprises zirconium dioxide.

12. The method, as recited in claim 11, wherein the metal containing precursor step comprises depositing a metal containing precursor of at least one of zirconium (IV) tert-butoxide, tetrakis(diethylamido) zirconium (IV), tetrakis(dimethylamido) zirconium (IV), tetrakis(ethylmethylamido) zirconium (IV), zirconium tetrachloride and wherein the reactant step comprises providing a reactant that is at least one of water vapor, oxygen, peroxide, or ozone.

13. The method, as recited in claim 5, wherein the sacrificial mask comprises titanium oxide.

14. The method, as recited in claim 13, wherein the metal containing precursor step comprises depositing a metal containing precursor of at least one of titanium(IV) isopropoxide, tetrakis(diethylamido)titanium(IV), tetrakis(dimethylamido)titanium(IV), tetrakis(ethylmethylamido)titanium (IV), titanium tetrachloride and wherein the reactant step comprises providing a reactant that is at least one of water vapor, oxygen, peroxide, or ozone.

15. The method, as recited in claim 4, wherein the selectively depositing the inhibitor layer comprises depositing a self assembled monolayer that selectively deposits on the silicon oxide region with respect to the lower oxygen silicon containing region.

16. The method, as recited in claim 4, further comprising cleaning the silicon oxide region and lower oxygen silicon containing region with a gaseous or aqueous solution of hydrogen fluoride before depositing the inhibitor layer.

17. The method, as recited in claim 4, further comprising providing a clean after depositing the sacrificial mask.

18. The method, as recited in claim 4, further comprising providing a pre-treatment after depositing the inhibitor layer and before depositing the sacrificial mask, wherein the pre-treatment enhances reactive sites of the lower oxygen silicon containing region by activation or deactivates the inhibitor layer.

19. A method for selectively etching a silicon or SiN region with respect to a higher oxygen containing region with an OH surface termination, comprising:
 a) selectively depositing a sacrificial mask on the higher oxygen containing region with respect to the silicon or SiN region; and
 b) selectively etching the silicon or SiN region with respect to the sacrificial mask on the higher oxygen containing region, comprising a plurality of cycles, wherein each cycle, comprises:
  i) providing a reactant gas to selectively form a deposition layer on the silicon oxide region;
  ii) purging the reactant gas; and
  iii) providing an activation gas causing the deposition layer to be activated resulting in at least partially etching the silicon oxide region and the sacrificial mask.

20. The method as recited in claim 19, wherein the sacrificial mask comprises a metal oxide, wherein the metal oxide is deposited selectively onto the higher oxygen containing region.

21. The method, as recited in claim 20, wherein the metal oxide comprises a titanium oxide deposited by a thermal ALD process, using a cyclic process between a Ti containing precursor and an oxidizer used to deposit the titanium oxide, wherein the oxidizer is at least one of water vapor, oxygen, peroxide, or ozone.

* * * * *